(12) United States Patent
Perng et al.

(10) Patent No.: US 6,498,067 B1
(45) Date of Patent: Dec. 24, 2002

(54) INTEGRATED APPROACH FOR CONTROLLING TOP DIELECTRIC LOSS DURING SPACER ETCHING

(75) Inventors: Baw-Ching Perng, Hsin-Chu (TW); Ming-Huang Tsai, Hsinchu (TW); Ju-Wang Hsu, Taipei (TW); Hun-Jan Tao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/139,021

(22) Filed: May 2, 2002

(51) Int. Cl.$^7$ ............................................. H01L 21/336
(52) U.S. Cl. ........................ 438/305; 438/592; 438/595
(58) Field of Search ................................. 438/305, 306, 438/307, 592, 595, 596, 655

(56) References Cited

U.S. PATENT DOCUMENTS

| | | | | |
|---|---|---|---|---|
| 5,920,783 A | * | 7/1999 | Tseng et al. | 438/592 |
| 5,994,192 A | * | 11/1999 | Chen | 438/305 |
| 5,994,227 A | | 11/1999 | Matsuo et al. | 438/696 |
| 6,165,913 A | | 12/2000 | Lin et al. | 438/761 |
| 6,190,961 B1 | | 2/2001 | Lam et al. | 438/253 |
| 6,218,275 B1 | | 4/2001 | Huang et al. | 438/595 |
| 6,242,354 B1 | | 6/2001 | Thomas | 438/696 |
| 6,440,875 B1 | * | 8/2002 | Chan et al. | 438/595 |
| 6,455,383 B1 | * | 9/2002 | Wu | 438/595 |

* cited by examiner

Primary Examiner—Chandra Chaudhari
(74) Attorney, Agent, or Firm—George O. Saile; Stephen B. Ackerman

(57) ABSTRACT

A process for forming a composite insulator spacer on the sides of a MOSFET gate structure, has been developed. The process features formation of additional insulator spacer shapes on top portions of sides of a gate structure in which an initial insulator spacer had been removed during an over etch cycle used for definition of the initial insulator spacer. The re-establishment of insulator spacer shapes provides a composite insulator spacer offering reduced risk of gate to substrate leakage or shorts, that can occur during a subsequent salicide procedure from the presence of metal silicide stringers or ribbons formed on, and residing on the composite insulator spacer.

26 Claims, 4 Drawing Sheets

INTEGRATED APPROACH FOR CONTROLLING TOP DIELECTRIC LOSS DURING SPACER ETCHING

BACKGROUND OF THE INVENTION (1) Field of the Invention

The present invention relates to methods used to fabricate semiconductor devices, and more specifically to a method used to form a composite insulator spacer on the sides of a metal oxide semiconductor field effect transistor (MOSFET), gate structure.

(2) Description of Prior Art

The use of salicide (self-aligned metal silicide), processing, enabling a metal silicide layer to be selectively formed only on gate and source/drain regions, has allowed increased performance of MOSFET structures to be realized. The low resistivity metal silicide layers, such as titanium silicide, cobalt silicide, tantalum silicide or tungsten silicide lower word line resistance when formed on underlying polysilicon gate structures. Salicide processing is made possible by the presence of an insulator spacer located on the sides of a gate structure, allowing the deposited metal used for salicide formation, to remain unreacted during an anneal procedure used to form metal silicide on exposed silicon regions, such as word line and source/drain surfaces. The unreacted metal, located on the surface of the insulator spacer, is then selectively removed via wet etch procedures. Therefore the integrity of the insulator spacer is critical in preventing gate to substrate leakage and shorts.

To improve the integrity of the insulator spacer, and to reduce the risk of gate to substrate failures occurring during salicide processing, composite insulator spacers have been employed. The composite insulator spacer, usually comprised with an underlying silicon oxide layer, and an overlying silicon nitride layer, can better survive the rigorous salicide process regarding metal deposition, annealing, and removal of unreacted metal, when compared to non-composite insulator spacers. The formation of composite insulator spacers however can result in removal of a top portion of the composite spacer during a spacer over etch cycle, used to insure complete spacer formation in regions in which poor insulator thickness uniformity existed. The removal of the top portion of the composite insulator spacer exposes a portion of the sides of a gate structure thus allowing metal silicide to be formed on this region, which in turn reduces the distance between the gate and source/drain region, thus reducing the distance unwanted salicide stringers, or ribbons, formed during the salicide process on the truncated spacer, have to traverse to result in the unwanted phenomena of gate to substrate leakage or shorts.

The present invention will describe a process in which re-formation of sidewall insulator is used post-composite insulator spacer definition, to reduce the risk of salicide bridging resulting from a composite insulator spacer truncated, or with a top portion of the composite insulator spacer removed, during the spacer formation. Prior art, such as Thomas, in U.S. Pat. No. 6,242,354, as well as Huang et al, in U.S. Pat. No. 6,218,275, describe methods of forming insulator spacers, however these prior arts do not describe the novel procedures now described in the present invention in which re-formation of portions of insulator spacer, possibly removed during an initial spacer formation procedure, is accomplished.

SUMMARY OF THE INVENTION

It is an object of this invention to selectively form metal silicide layers on a gate structure and on a source/drain region of a MOSFET device.

It is another object of this invention to form a composite insulator spacer on the sides of the MOSFET gate structure, to allow the selective metal silicide, or silicide formation procedure to be practised.

It is still another object of this invention to form additional insulator spacer shapes on the sides of the composite insulator spacer, or on the sides of portions of gate structure, exposed as a result of removal of a top portion of the composite insulator during a dry etch over etch cycle, used as part of the composite insulator spacer definition procedure.

In accordance with the present invention a method of re-establishing insulator spacer shapes on the sides a gate structure, where portions of the initial composite insulator spacer were removed during a dry etch over etch cycle, used as part of the composite insulator spacer definition procedure, is described. After formation of a gate structure on an underlying gate insulator layer, a lightly doped source/drain region is formed in a region of the semiconductor substrate not covered by the gate structure. A thin first insulator layer is deposited, followed by deposition of a second insulator layer. A first anisotropic, reactive ion etching (RAE) procedure is then performed to the second insulator layer, defining a second insulator spacer shape, with the RIE procedure selectively terminating at the appearance of the top surface of the thin first insulator layer located on the top surface of the gate structure. The first anisotopic RIE procedure is then continued to insure complete removal of the second insulator layer in regions of thickness un-uniformity, or in regions in which the second insulator layer formed in crevices or micro-trenches in the semiconductor substrate, located near a shallow trench isolation shape. The over etch procedure results in removal of a top portion of the second insulator component of the composite insulator spacer, exposing a portion of the sides of the gate structure or a portion of the thin first insulator layer still located on the sides of the gate structure. A third insulator layer is next deposited followed by a second anisotropic RIE procedure, employed to again selectively terminate at the appearance of the thin, first insulator layer located on the top surface of the gate structure. This results in formation of third insulator shapes located on the sides of the thin, first insulator layer, exposed during the first anisotropic RIE procedure, in addition to resulting in third insulator shapes located on the bottom portion of the truncated second insulator shape. After formation of a heavily doped source drain region, portions of the thin, first insulator layer, located on the top surfaces of the gate structure and on the surface of the heavily doped source/drain region, are selectively removed. A metal layer is next deposited and subjected to an anneal resulting in metal silicide formation on the top surface of silicon regions. Unreacted metal, located on the composite insulator layer, now comprised of an underlying, thin first insulator layer, a truncated second insulator shape, and third insulator shapes located on the exposed surface of the thin, first insulator layer, and on the surface of the truncated second insulator shape, is selectively removed via wet etch procedures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

Figure 1:
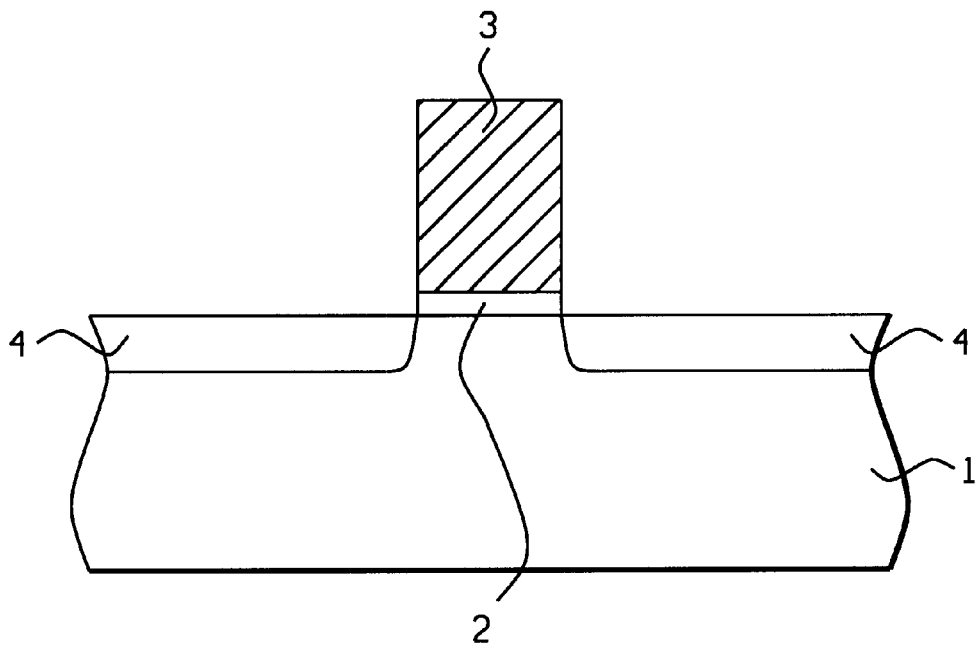
FIGS. 1–7, which schematically, and in cross-sectional style, describe key stages of fabrication used to form a final composite insulator spacer shape on the sides of a gate structure, featuring additional insulator spacer shapes formed on a previously defined initial composite insulator shape, in which portions had been removed during a dry etch over etch cycle, used as part of the initial composite insulator spacer definition procedure.

The method of forming a final composite insulator spacer structure on the sides of a gate structure, featuring additional insulator spacers shapes formed on a previously defined composite insulator spacer shape, truncated during the initial spacer definition over etch cycle, will now be described in detail. Semiconductor substrate 1, comprised of P type, single crystalline silicon, featuring a <100> crystallographic orientation, is used and schematically shown in FIG. 1. Gate insulator layer 2, comprised of silicon dioxide, is thermally grown to a thickness between about 15 to 150 Angstroms, in an oxygen—steam ambient, followed by the formation of overlying gate structure 3. The process used to form gate structure 3, initiates with the deposition of a polysilicon layer, grown to a thickness between about 500 to 2500 Angstroms, via low pressure chemical vapor deposition (LPCVD) procedures. The polysilicon layer can either be doped in situ during deposition via the addition of arsine, or phosphine, to a silane ambient, or the polysilicon layer can be deposited intrinsically then doped via implantation of arsenic or phosphorous ions. Conventional photolithographic and anisotropic RIE procedures, using $Cl_2$ or $SF_6$ as an etchant, are used to define gate structure 3. The width of gate structure 3, is between about 0.05 to 0.50 um. Removal of the photoresist shape, used as an etch mask for gate structure 3, is accomplished via plasma oxygen ashing procedures. If lower word line resistance is desired a polycide gate structure can be used in place of polysilicon gate structure 3. This is accomplished via deposition of an underlying, in situ doped polysilicon layer, followed by the deposition, via LPCVD procedures, of an overlying metal silicide layer, such as tungsten silicide. A photoresist shape is again used as an etch mask allowing the anisotropic RIE procedure to define gate structure 3, again using either $Cl_2$ or $SF_6$ as an etchant for both the metal silicide and polysilicon layers. A first ion implantation procedure is next performed using arsenic or phosphorous ions, at an energy between about 1 to 10 KeV, at an implant dose between about 1E14 to 9E15 atoms/$cm^2$, resulting in formation of lightly doped source/drain (LDD) region 4, in an area of semiconductor substrate 1, not covered by gate structure 3. The result of these procedures are schematically shown in FIG. 1.

Figure 2:
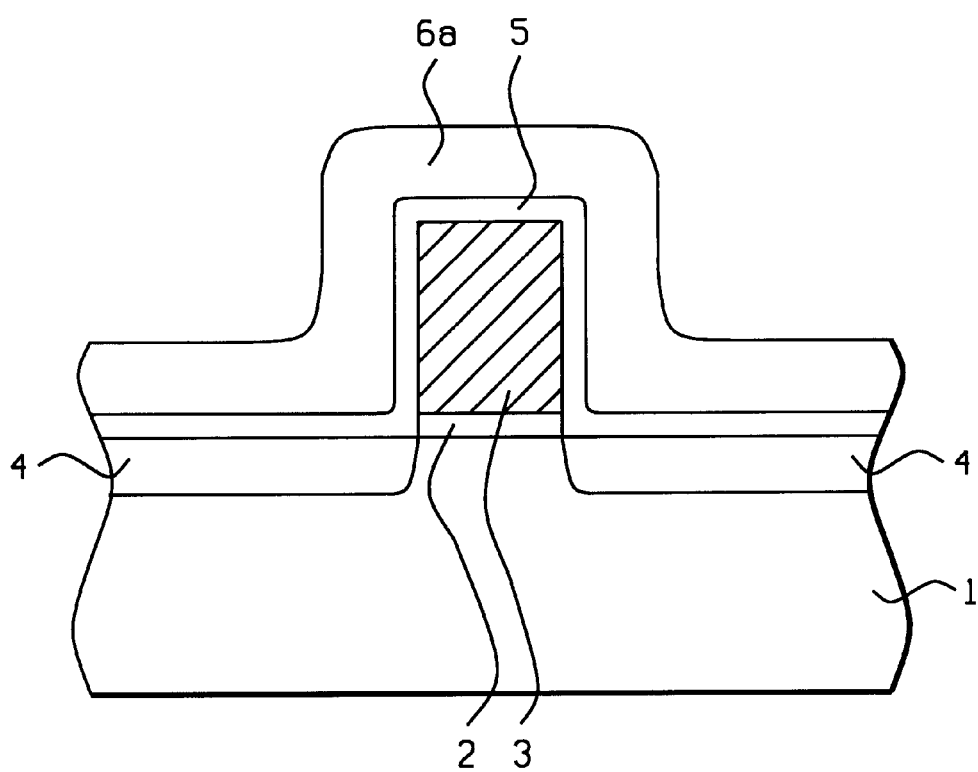

Thin, first insulator layer, or liner layer 5, comprised of silicon oxide, is next formed on the sides of gate structure 3, at a thickness between about 30 to 200 Angstroms. Liner layer 5, can be obtained via LPCVD or via plasma enhanced chemical vapor deposition (PECVD) procedures, or liner layer 3, can be obtained via thermal oxidation procedures. Second insulator layer 6a, comprised of a material which will exhibit a faster removal rate then liner layer 5, in a specific dry etch ambient, is next deposited at a thickness between about 200 to 1000 Angstroms. Second insulator layer 6a, can be comprised of silicon nitride or silicon oxynitride, with either featuring a higher rate of removal then liner layer 5, in a dry etch ambient such as $Cl_2$. The result of these depositions are shown schematically in FIG. 2.

Figure 3:
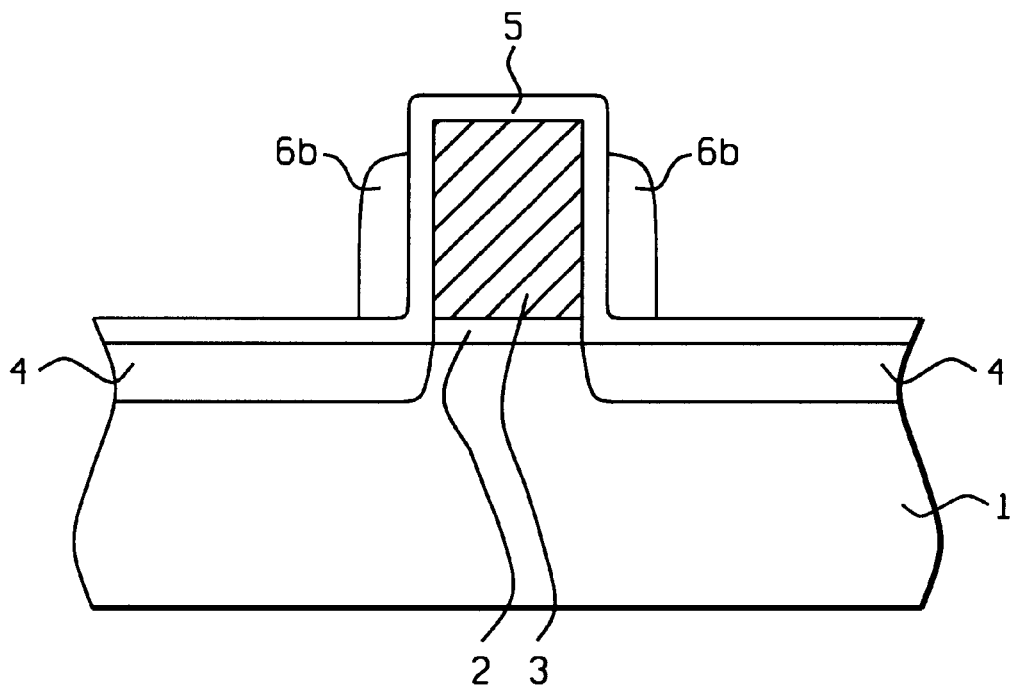

A first anisotropic RIE procedure is next employed to define a spacer shape in second insulator layer 6a. The anisotropic RIE procedure is performed using $Cl_2$ as an etchant, with a selectivity, or an etch rate ratio of second insulator layer 6a, (silicon nitride or silicon oxynitride), to liner layer 5, (silicon oxide), of between about 5 to 1, to 20 to 1. The high etch rate ratio, or selectivity, allows the regions of liner layer 5, to survive an over etch cycle, used to insure complete removal of second insulator layer, in area in which, due to poor deposition uniformity, thicker layers of second insulator layer 6a, are present. In addition thicker layers of second insulator layer 6a, may also exist in trenches or crevices, (not shown in the drawings), that were formed in semiconductor substrate 1, during previous dry etching procedures, therefore making necessary the over etch cycle used at the conclusion of the first anisotropic RIE procedure. The over etch cycle however, in addition to defining second insulator sapper shape 6b, located on the sides of liner layer 5, also removes a top portion of second insulator spacer shape 6b, exposing a portion of liner layer 5, located on the sides of gate structure 3. The result of the first anisotropic RIE procedure is schematically shown in FIG. 3. The exposure of this portion of liner layer 5, and the subsequent use of a wet etch to selectively remove liner layer 5, from the top surface of gate structure 3, prior to salicide processing, would then expose a portion of the sides of gate structure 3, to a subsequent salicide procedure therefore reducing the non-salicided distance between gate structure 3, and source/drain regions. The reduction in distance between truncated, second insulator spacer shape 6b, and semiconductor substrate increase the possibility of gate to substrate shorts or leakage after salicide formation. The reduced length of truncated, second insulator spacer shape 6b, may not be sufficient to prevent metal silicide ribbons or stringers from extending from the salicided gate structure to a salicided source/drain region.

Figure 4:
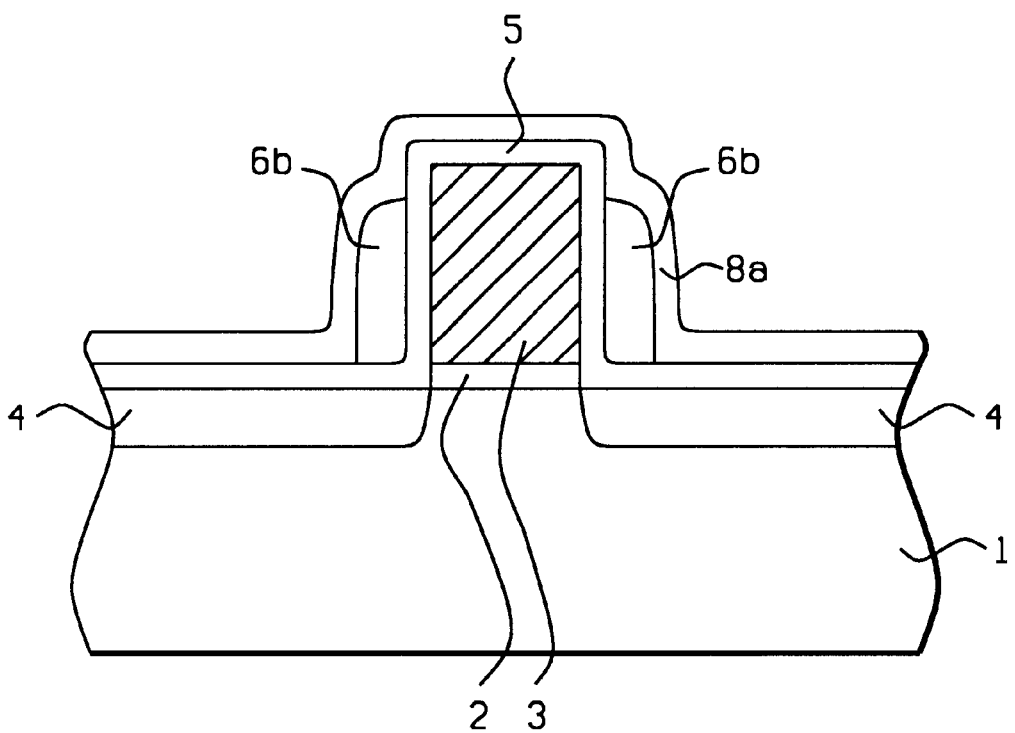
Figure 5:
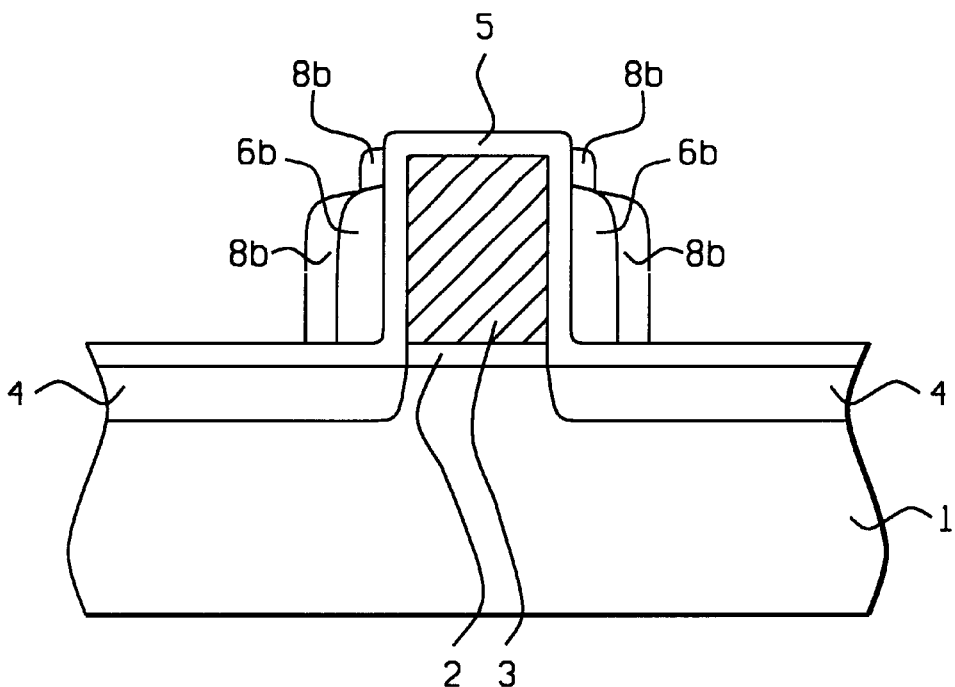

The formation of additional insulator spacer shapes, used to replace the truncated portions of second insulator spacer shapes 6b, is next addressed, and schematically described via FIGS. 4–5. Third insulator layer 8a, comprised of a material different than liner layer 5, in regards to etch rate in a specific ambient, is next deposited to a thickness between about 50 to 300 Angstroms, via LPCVD or PECVD procedures. This is schematically shown in FIG. 4. Third insulator layer 8a, can be the same material as second insulator spacer shapes 6b, such a silicon nitride or silicon oxynitride layer, but again can not be a silicon oxide layer, such as liner layer 5. An additional criteria is that third insulator layer 8a, be thinner than second insulator layer 6a, or second insulator space shape 6b. A second anisotropic RIE procedure, using $CHF_3$ as an etchant, is then employed to remove portions of third insulator layer 8a, located normal in direction to the defining dry etch ambient. The etch rate ratio of silicon nitride, or silicon oxynitride, to silicon oxide, is between about 5 to 1, to 20 to 1, in a $CHF_3$ etch ambient, therefore allowing the dry etch procedure to slow or terminate at the appearance of liner layer 5, located on the top surface of gate structure 3. The critical aspect of this procedure is the re-establishment of insulator spacers in regions in which second insulator spacer shape 6b, was truncated during the over etch cycle of the first anisotropic RIE procedure. Third insulator spacer shapes 8b, are now formed on exposed sides of liner layer 5, offering increased protection to gate structure 3, during a subsequent salicide formation procedure. Portions of third insulator spacer shapes 8b, are also formed on the sides of second insulator spacer shapes 6b. The result of the second anisotropic RIE procedure, and the formation of third insulator spacer shapes 8b, is schematically shown in FIG. 5. The thinness of third insulator layer 8a, reduced the risk of this layer filling a micro-trench or crevice in the semiconductor substrate, thus allowing for easy and complete removal of this material, even in regions in which deposition in a micro-trench had occurred.

Heavily doped source/drain region 7, is next formed via a second ion implantation procedure, using arsenic or phosphorous ions, performed at an energy between about 10 to 100 KeV, at a implant dose between about 1E15 to 9E15 atoms/cm$^2$, placing the implanted ions in an area of semiconductor substrate 1, not covered by gate structure 3, by third insulator shapes 8b, by second insulator spacer shape 6b, or by liner layer 5. An anneal cycle is next performed at a temperature between about 700 to 1200° C., via rapid thermal anneal (RTA), or via conventional furnace procedures, to activate the implanted ions creating heavily doped source/drain region 7, schematically shown in FIG. 6.

Figure 6:
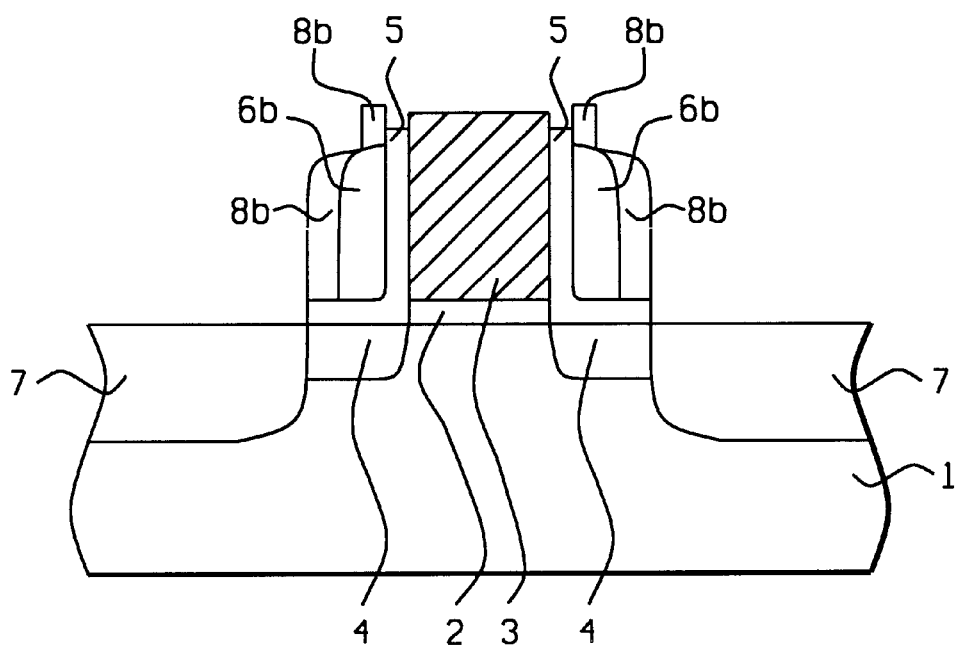
Figure 7:
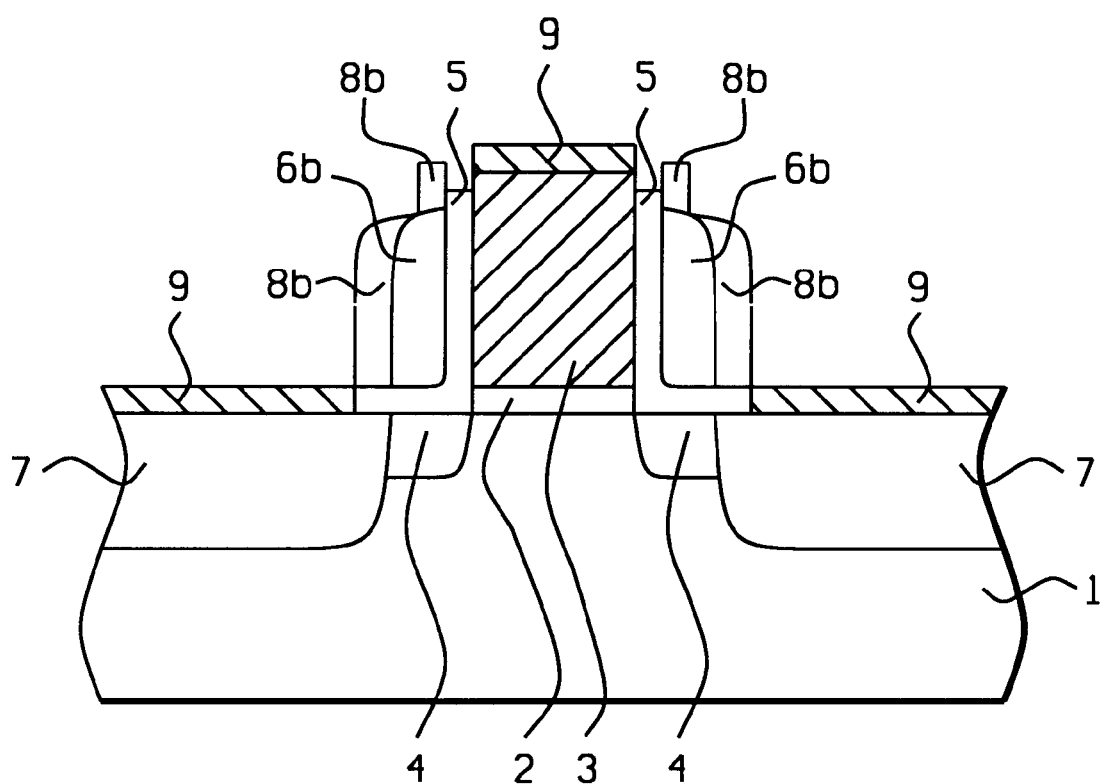

The formation of metal silicide on exposed silicon, and polysilicon surfaces, is next addressed and schematically shown using FIGS. 6–7. A wet etch procedure, using a buffered hydrofluoric (BHF), or a dilute HF (DHF), solution, is used to selectively remove exposed regions of liner layer 5, located on the top surface of gate structure 3, and on the top surface of heavily doped source/drain region 7. This is schematically shown in FIG. 6.

A metal layer such as cobalt, titanium, nickel, tantalum, or tungsten is next deposited via plasma vapor deposition (PVD) procedures at a thickness between about 20 to 200 Angstroms. An anneal procedure, performed using either using RTA or conventional furnace procedures, is next employed at a temperature between about 400 to 1000° C., for a time between about 10 to 60 sec., to form metal silicide layer 9, on the top surface of gate structure 3, and on the top surface of heavily doped source/drain region 7. Metal silicide layer 9, can be a cobalt silicide layer, a titanium silicide layer, a nickel silicide layer, a tantalum silicide layer, or a tungsten silicide layer. Portions of the metal layer residing on the surface of third insulator spacer shape 8b, or on the surface of second insulator spacer shape 6b, remain unreacted. During the anneal the salicide procedure, a procedure used to self-align, or to selectively form metal silicide only on underlying silicon or polysilicon regions, metal silicide stringers or ribbons can form on the insulator spacers with a possible risk of bridging between the metal silicide layers located on the gate and source/drain regions. This unwanted phenomena would result in gate to substrate leakage or shorts. The presence of the re-established, third insulator spacer shapes 8b, protected liner layer 5, during the BHF or DHF procedures, therefore not exposing sides of gate structure 3, and thus not allowing metal silicide to be formed on the sides of gate structure 3. The increased distance between metal silicide layers on gate structure 3, and heavily doped source/drain region 7, achieved via re-establishment of third insulator spacer shapes 8b, reduced the risk of unwanted bridging between these salicided regions via metal silicide ribbons or stringers. The unreacted metal, located on the sides of the insulator spacer shapes, is next selectively removed in a solution of $H_2SO_4$—$H_2O_2$—HCl—$NH_4OH$, at a temperature between about 50 to 150° C. The result of metal silicide layer 9, formed on the top surface of gate structure 3, and on the top surface of heavily doped source/drain region 7, is schematically shown in FIG. 7.

While this invention has been particularly shown and described with reference to, the preferred embodiments thereof, it will be understood by those skilled in the art that various changes in form and details may be made without departing from the spirit and scope of this invention.

What is claimed is:

1. A method of forming a composite insulator spacer on the sides of a gate structure, on a semiconductor substrate, comprising the steps of:

forming a gate insulator layer on said semiconductor substrate;

forming said gate structure on said gate insulator layer;

depositing a first insulator layer;

forming second insulator spacer shapes, from a second insulator layer, on sides of said first insulator layer, exposing the portion of said first insulator layer located on a top surface of said gate structure;

removing a top portion of said second insulator spacer shapes, resulting in truncated second insulator spacer shapes now located on the sides of a bottom portion of said first insulator layer, and resulting in exposure of a top portion of the sides of said first insulator layer;

creating third insulator spacer shapes, from a third insulator layer, on said top portion of the sides of said first insulator layer, and creating third insulator spacer shapes on the sides of said truncated second insulator spacer shapes; and selectively removing exposed regions of said first insulator layer.

2. The method of claim 1, wherein said gate structure is comprised of polysilicon, defined from a polysilicon layer which in turn is deposited via LPCVD procedures to a thickness between about 500 to 2500 Angstroms, and doped in situ during deposition via the addition of arsine, or phosphine to a silane ambient.

3. The method of claim 1, wherein said first insulator layer is a silicon oxide layer, obtained via LPCVD or PECVD procedures, at a thickness between about 30 to 200 Angstroms.

4. The method of claim 1, wherein said first insulator layer is a silicon oxide layer, obtained via thermal oxidation procedures, to a thickness between about 30 to 200 Angstroms.

5. The method of claim 1, wherein said second insulator layer is a silicon nitride layer, obtained via LPCVD or PECVD procedures, to a thickness between about 200 to 1000 Angstroms.

6. The method of claim 1, wherein said second insulator layer is a silicon oxynitride layer, obtained via LPCVD or PECVD procedures, to a thickness between about 200 to 1000 Angstroms.

7. The method of claim 1, wherein said second insulator spacers are formed via a first anisotropic RIE procedure, using $CHF_3$ as an etchant.

8. The method of claim 1, wherein an etch rate ratio of said second insulator layer to said first insulator layer, using a $CHF_3$ etchant, is between about 5 to 1, to 20 to 1.

9. The method of claim 1, wherein said third insulator layer is a silicon nitride layer, obtained via LPCVD or PECVD procedures, at a thickness between about 50 to 300 Angstroms.

10. The method of claim 1, wherein said third insulator layer is a silicon oxynitride layer, obtained via LPCVD or PECVD procedures, at a thickness between about 50 to 300 Angstroms.

11. The method of claim 1, wherein said third insulator spacers are formed via a second anisotropic RIE procedure, using $CHF_3$ as an etchant.

12. The method of claim 1, wherein an etch rate ratio of said third insulator layer to said first insulator layer, using a $CHF_3$ etchant, is between about 5 to 1, to 20 to 1.

13. The method of claim 1, wherein said first insulator layer is selectively removed using a wet etch solution comprised with either buffered HF, or dilute HF.

14. A method of fabricating a MOSFET device featuring the formation of insulator spacer shapes on the sides of a truncated composite insulator spacer, comprising the steps of:

growing a gate insulator layer on a semiconductor substrate;

forming a polysilicon gate structure on said gate insulator layer;

forming a lightly doped source/drain (LDD), region in an area of said semiconductor substrate not covered by said polysilicon gate structure;

forming a silicon oxide liner layer on said polysilicon gate structure and on top said LDD region;

depositing a first silicon nitride layer;

performing an initial phase of a first anisotropic RIE procedure to form first silicon nitride spacer shapes, with said first anisotropic RIE procedure terminating at the top surface of said silicon oxide line layer located on the top surface of said polysilicon gate structure;

performing an over etch cycle phase of said first anisotropic RIE procedure, resulting in removal of top portions of said first silicon nitride spacer shapes exposing sides of a top portion of said silicon oxide liner layer, and creating truncated silicon nitride spacer shapes on the sides of a bottom portion of said silicon oxide liner layer;

depositing a thin, second silicon nitride layer;

performing a second anisotropic RIE procedure, terminating at the top surface of said silicon oxide liner layer located on the top surface of said polysilicon gate structure, and forming second silicon nitride spacer shapes on sides of exposed portions of said silicon oxide liner layer, and forming second silicon nitride spacer shapes on the sides of said truncated silicon nitride spacer shapes, resulting in a composite insulator spacer on the sides of said polysilicon gate structure, comprised of second silicon nitride spacer shapes, comprised of said truncated silicon nitride spacer shapes, and comprised of said silicon oxide liner layer;

forming a heavily doped source/drain region in an area of said semiconductor substrate not covered by said polysilicon gate structure or by said composite insulator spacer;

selectively removing exposed portions of said silicon oxide liner layer from the top surface of said polysilicon gate structure and from the top surface of said heavily doped source/drain region;

depositing a metal layer;

performing an anneal cycle to convert said metal layer to a metal silicide layer on said polysilicon gate structure, and on said heavily doped source/drain region, while leaving unreacted metal on the surface of said composite insulator spacer; and selectively removing said unreacted metal from the sides of said composite insulator spacer.

15. The method of claim 14, wherein said polysilicon gate structure is defined from a polysilicon layer which in turn is obtained via LPCVD procedures at a thickness between about 500 to 2500 Angstroms, and doped in situ during deposition via the addition of arsine, or phosphine to a silane ambient.

16. The method of claim 14, wherein said silicon oxide liner layer is obtained via LPCVD or PECVD procedures, at a thickness between about 30 to 200 Angstroms.

17. The method of claim 14, wherein said silicon oxide liner layer is obtained via thermal oxidation procedures, to a thickness between about 30 to 200 Angstroms.

18. The method of claim 14, wherein said first silicon nitride layer is obtained via LPCVD or PECVD procedures, to a thickness between about 200 to 1000 Angstroms.

19. The method of claim 14, wherein said initial phase of said first anisotropic RIE procedure is performed using $CHF_3$ as an etchant.

20. The method of claim 14, wherein an etch rate ratio of said first silicon nitride layer to said silicon oxide liner layer, using a $CHF_3$ etchant, is between about 5 to 1, to 20 to 1.

21. The method of claim 14, wherein said over etch phase of said first anisotropic RIE procedure is performed using $CHF_3$ as an etchant, with an etch rate ratio of said first silicon nitride layer to said silicon oxide liner layer, of between about 5 to 1, to 20 to 1.

22. The method of claim 14, wherein said thin, second silicon nitride layer is obtained via LPCVD or PECVD procedures at a thickness between about 50 to 300 Angstroms.

23. The method of claim 14, wherein said second anisotropic RIE procedure is performed using $CHF_3$ as an etchant, with an etch rate ratio of said thin, second silicon nitride layer, to said silicon oxide liner layer of between about 5 to 1, to 20 to 1.

24. The method of claim 14, wherein said silicon oxide liner layer is selectively removed using a wet etch solution comprised with either buffered HF, or dilute HF.

25. The method of claim 14, wherein said metal, used for formation of said metal silicide layer, is chosen from a group that includes cobalt, nickel, titanium, tantalum and tungsten, and is obtained via plasma vapor deposition procedures at a thickness between about 20 to 200 Angstroms.

26. The method of claim 14, wherein said unreacted metal is removed from the sides of said composite insulator spacer via a wet solution comprised of $H_2SO_4$—$H_2O_2$—HCl—$NH_4OH$, at a temperature between about 50 to 150° C.

* * * * *